US008860092B1

(12) United States Patent
Li et al.

(10) Patent No.: US 8,860,092 B1
(45) Date of Patent: Oct. 14, 2014

(54) METALLIC SUB-COLLECTOR FOR HBT AND BJT TRANSISTORS

(75) Inventors: James Chingwei Li, Simi Valley, CA (US); Donald A. Hitko, Grover Beach, CA (US); Yakov Royter, Santa Monica, CA (US); Pamela R. Patterson, Los Angeles, CA (US)

(73) Assignee: HRL Laboratories, LLC, Malibu, CA (US)

( * ) Notice: Subject to any disclaimer, the term of this patent is extended or adjusted under 35 U.S.C. 154(b) by 1128 days.

(21) Appl. No.: 12/234,911

(22) Filed: Sep. 22, 2008

(51) Int. Cl.
| | | |
|---|---|---|
| H01L 31/0328 | (2006.01) | |
| H01L 31/0336 | (2006.01) | |
| H01L 27/082 | (2006.01) | |
| H01L 29/66 | (2006.01) | |
| H01L 29/737 | (2006.01) | |

(52) U.S. Cl.
CPC ...... *H01L 29/66242* (2013.01); *H01L 29/7371* (2013.01)
USPC ..... 257/197; 257/584; 257/587; 257/E29.034

(58) Field of Classification Search
CPC .................... H01L 29/7371; H01L 29/66242; H01L 21/743; H01L 29/0821
USPC ........... 257/197, 587, 593, 565, 584, E29.034
See application file for complete search history.

(56) References Cited

U.S. PATENT DOCUMENTS

| | | | | |
|---|---|---|---|---|
| 4,292,730 A | * | 10/1981 | Ports .............................. | 438/408 |
| 4,870,475 A | * | 9/1989 | Endo et al. .................... | 257/508 |
| 6,414,371 B1 | * | 7/2002 | Freeman et al. .............. | 257/584 |
| 2001/0015789 A1 | * | 8/2001 | Park et al. ...................... | 349/187 |
| 2002/0017703 A1 | * | 2/2002 | Kim et al. ...................... | 257/587 |
| 2003/0094672 A1 | * | 5/2003 | Torvik et al. .................. | 257/565 |
| 2004/0212034 A1 | * | 10/2004 | Mochizuki et al. ........... | 257/502 |
| 2005/0056903 A1 | * | 3/2005 | Yamamoto et al. ........... | 257/433 |
| 2006/0081879 A1 | * | 4/2006 | Tanaka et al. ................. | 257/197 |

OTHER PUBLICATIONS

T. Arai et al, "Proposal of Buried Metal Heterojunction Bipolar Transistor and Fabrication of HBT with Buried Tungsten", 1999 International Conference on InP Phosphide and Related Materials, Proceedings, pp. 183-186.
T. Arai et al, "C. in GaInAs/InP Buried Metal Heterojunction Bipolar Transistor", 2000 International Conference on InP Phosphide and Related Materials, Proceedings, pp. 254-257.

* cited by examiner

*Primary Examiner* — Shouxiang Hu
(74) *Attorney, Agent, or Firm* — Ladas & Parry

(57) ABSTRACT

A heterojunction bipolar transistor having an emitter, a base, and a collector, the heterojunction bipolar transistor including a metallic sub-collector electrically and thermally coupled to the collector wherein the metallic sub-collector comprises a metallic thin film, and a collector contact electrically connected to the metallic sub-collector.

10 Claims, 8 Drawing Sheets

FIG. 1 PRIOR ART

| Number | Device Layer | Conventional HBT | | |
|---|---|---|---|---|
| 1 | Emitter Cap | N+ InGaAs | 100nm | |
| 2 | Emitter | N InP | 20nm | 12 |
| 3 | Base | P+ InGaAs | 40nm | |
| 4 | Base-Collector Grade | n- Grade Material | 30nm | 14 |
| 5 | Collector | n- InP | 90nm | |
| 6 | Collector Contact (15) | N+ InGaAs | 25nm | |
| 7 | Sub-Collector (17) | N+ InP | 250nm | 16 |
| | Substrate | Semi-insulating InP | 600μm | |

| Number | Device Layer | Metallic Sub-Collector HBT | | |
|---|---|---|---|---|
| 1 | Emitter Cap | N+ InGaAs | 100nm | |
| 2 | Emitter | N InP | 20nm | 22 |
| 3 | Base | P+ InGaAs | 40nm | |
| 4 | Base-Collector Grade | n- Grade Material | 30nm | 24 |
| 5 | Collector | n- InP | 90nm | |
| 6 | Collector Contact (25) | N+ InP | 25nm | |
| 7 | Sub-Collector (27) | Metal | >50nm | 26 |
| | Substrate | Semi-insulating InP | 600μm | |

20

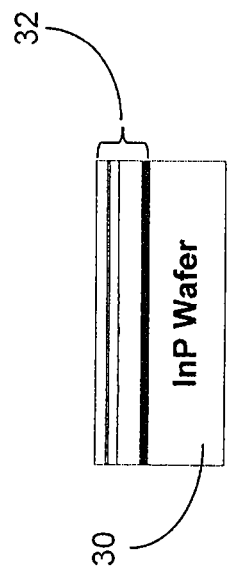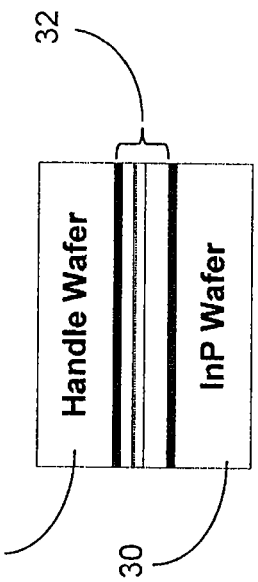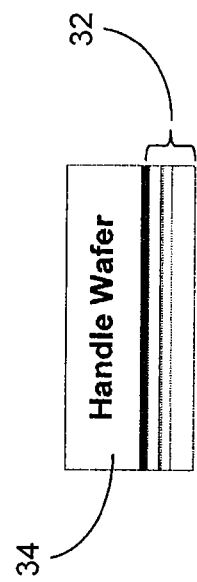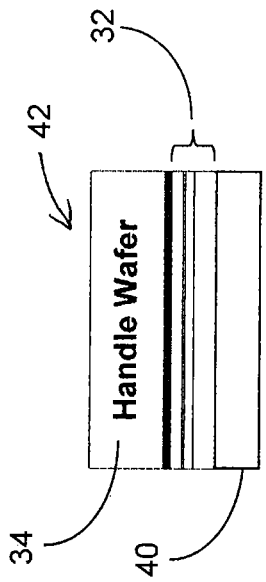

METALLIC SUB-COLLECTOR FOR HBT AND BJT TRANSISTORS

STATEMENT REGARDING FEDERALLY SPONSORED RESEARCH OR DEVELOPMENT

The present invention was made with support from the United States Government under contract FA8650-07-C-7714 awarded by DARPA. The United States Government has certain rights in the invention.

FIELD

This disclosure relates to bipolar junction transistors (BJTs) and heterojunction bipolar transistors (HBTs), and in particular to sub-collectors for BJTs and HBTs.

BACKGROUND

Self heating and other thermal management challenges have long existed for BJTs and HBTs. These thermal management issues have become increasingly important as BJT and HBT transistors decrease in size and performance increases. As an example of how thermal issues affect performance, conventional InP HBTs have been shown to have a 0.5 GHz $F_T$ reduction per ° C. of junction temperature rise.

T. Arai et al, "Proposal of Buried Metal Heterojunction Bipolar Transistor and Fabrication of HBT with Buried Tungsten", 1999 International Conference on InP Phosphide and Related Materials, Proceedings, pp. 183-6, and T. Arai et al, "$C_{BC}$ Reduction in GaInAs/InP Buried Metal Heterojunction Bipolar Transistor", 2000 International Conference on InP Phosphide and Related Materials, Proceedings, pp. 254-7, which are incorporated herein by reference, describe an approach to thermal management. In that approach thin fingers of tungsten are deposited on an InP substrate and the required epitaxial layers are grown on top of these tungsten fingers. When applied to HBTs the resulting device is called a buried metal HBT (BM-HBT).

The Arai method requires high quality epitaxial layers to be grown on an uneven, mixed composition (tungsten and InP) surface. This method is unlikely to ever produce epitaxial films of comparable quality to those grown only on an InP substrate, which also negatively affects reliability and performance.

This approach also requires that a metal resistant to the high temperatures needed for materials growth and a metal able to alloy to InP and its related materials must be selected. This fundamentally limits the metals compatible with the Arai method, and those metals are mostly refractory. Although tungsten has a fairly high thermal conductivity (170 W/mK) and fairly low electrical resistivity (5 μΩcm), it is not as thermally conductive or as low resistance as gold or aluminum (>300 W/mK and <3 μΩcm).

The tungsten fingers in the Arai method must also be finely patterned and comparable to the HBT dimensions to ensure proper materials growth and device fabrication. This places an additional demand on device fabrication and fundamentally limits the lateral sheet resistance of the buried metal sub-collector.

What is needed are apparatus and methods to mitigate the self-heating and other thermal management challenges associated with BJTs and HBTs. The embodiments of the present disclosure answer these and other needs.

SUMMARY

In a first embodiment disclosed herein, a heterojunction bipolar transistor having an emitter, a base, and a collector comprises a metallic sub-collector electrically and thermally coupled to the collector, wherein the metallic sub-collector comprises a metallic thin film, and a collector contact electrically connected to the metallic sub-collector.

In another embodiment disclosed herein, a bipolar junction transistor having an emitter, a base, and a collector comprises a metallic sub-collector electrically and thermally coupled to the collector, wherein the metallic sub-collector comprises a metallic thin film, and a collector contact electrically connected to the metallic sub-collector.

In yet another embodiment disclosed herein, a method of providing a transistor having an emitter, a base, and a collector comprises forming a metallic sub-collector electrically and thermally coupled to the collector, wherein the metallic sub-collector comprises a metallic thin film and forming a collector contact electrically connected to the metallic sub-collector.

These and other features and advantages will become further apparent from the detailed description and accompanying figures that follow. In the figures and description, numerals indicate the various features, like numerals referring to like features throughout both the drawings and the description.

BRIEF DESCRIPTION OF THE DRAWINGS

FIG. 1 is a table showing the device layer, material type, and layer thickness of an exemplary HBT with a conventional sub-collector in accordance with the prior art;

FIG. 2 is a table showing the device layer, material type, and layer thickness of an exemplary HBT with a metallic sub-collector in accordance with the present disclosure;

FIG. 3A is an elevation sectional view of the layers of FIG. 2 grown on a InP wafer in accordance with the present disclosure;

FIG. 3B is an elevation sectional view showing FIG. 3A with a handle wafer grown on top in accordance with the present disclosure;

FIG. 3C is an elevation sectional view showing the removal of the InP wafer from FIG. 3B in accordance with the present disclosure;

FIG. 3D is an elevation sectional view showing the handle wafer, the layers of FIG. 2, and a metallic sub-collector deposited below the layers of FIG. 2 in accordance with the present disclosure;

DETAILED DESCRIPTION

Figure 3E:
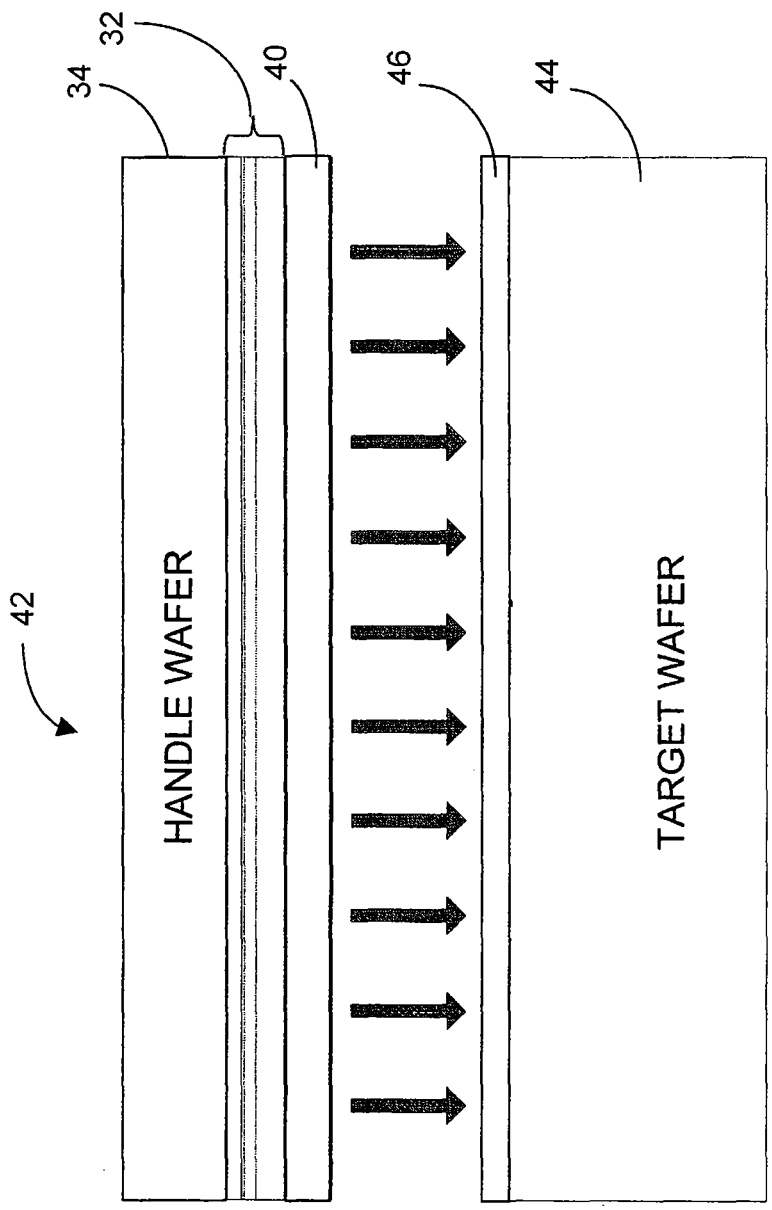
FIG. 3E is an elevation sectional view showing the metallic sub-collector of FIG. 3D being bonding to a target wafer in accordance with the present disclosure.

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

Referring to FIG. 1, table 10 shows the details of each layer for an exemplary HBT fabricated with a conventional sub-collector, in accordance with the prior art. The details for each layer include the device layer description 12, the material type 14, and the layer thickness 16. As shown in FIG. 1, a sub-collector with a thickness of 250 nm and material of n+ InP is grown on a semi-insulating InP substrate. On top of the sub-collector is a collector contact made of n+ InGaAs, which is about 25 nm thick. Above that are layers for the collector, base-collector grade, base, emitter and emitter cap.

Although it is desirable to have a low sub-collector resistance, the sheet resistance for a conventional sub-collector is usually limited to be no less than about 10Ω/sq. This limit is due to the limited total dopant concentration that can be added into a semiconductor thin film and the resulting thin film's carrier mobility, which is negatively impacted as the dopant concentration increases. Improved processing techniques may reduce sub-collector resistance to approximately 5 Ω/sq; however, any further reduction would be severely limited. The thickness of the sub-collector, which is on the order of 250 nm, also causes planarization issues.

FIG. 2, table 20 shows the details of each layer for an exemplary HBT fabricated with a metallic sub-collector in accordance with the present disclosure. The details for each layer include the device layer description 22, the material type 24, and the layer thickness 26.

Device layers are grown on a semi-insulating InP substrate using conventional methods such as Molecular Beam Epitaxy (MBE) or Metallo-Organic Chemical Vapor Deposition (MOCVD). One difference between a conventional HBT and an HBT of the present disclosure with a metallic sub-collector is the replacement of the low thermal conductivity InGaAs (5 W/mK) collector contact 15 in FIG. 1 with an equivalent thickness, high thermal conductivity InP (68 W/mK) collector contact 25 in FIG. 2. More importantly, in the exemplary HBT embodiment of FIG. 2, the semi-conductor InP sub-collector layer 17 of FIG. 1 is replaced with a metal sub-collector 27 of aluminum or gold. In other embodiments of an HBT or BJT with a metallic sub-collector, a semiconductor sub-collector may still be used together with the metallic sub-collector 27. In these embodiments the semiconductor sub-collector is between the collector and the metallic sub-collector and may have a material similar to the conventional sub-collector, but be substantially less thick that a conventional sub-collector, which may be about 250 nm thick. The thickness of the metallic sub-collector 27 may vary from as little as 50 nm to tens of microns thick. A thicker metallic sub-collector 27 is better for thermal conductivity.

FIGS. 3A to 3D are a sequence of illustrations of a process for fabricating a device having a metallic sub-collector. An indium phosphide (InP) wafer 30, about 600 μm thick, is used as a semi-insulating substrate. On top of the InP wafer 30, the collector contact, collector, base-collector grade, base, emitter, and emitter cap layers are grown, as shown in FIG. 2. As discussed above, a semiconductor sub-collector may be grown on the InP wafer before the collector contact. In FIG. 3A the collector contact, collector, base-collector grade, base, emitter, and emitter cap layers are shown together as device layers 32. In FIG. 3B a handle wafer 34 is bonded to the top of the device layers 32 next to the emitter cap layer. Next, the InP wafer 30 is removed as shown in FIG. 3C. The removal is performed by flipping the assembly of FIG. 3B upside down and performing processes to remove the InP wafer 30. Then a metallic sub-collector 40 is deposited on the exposed device layers 32 next to the collector contact layer or a semiconductor sub-collector, as shown in FIG. 3D, to form device 42.

In FIG. 3E, a target wafer 44 with an adhesion layer 46 is prepared. Then the metallic sub-collector 40 on device 42 is bonded to the adhesion layer 46 on the target wafer 44. The adhesion layer 46 can be a nonconductive material or a conductive material. For example, the adhesion layer 46 can be nonconductive glue or can be a metal, which is deposited on the target wafer. A preferred adhesive is benzocyclobutane, and alternative adhesives are polyimide, spin on glass and spin on epoxy. Preferred metals are gold, copper and aluminum. In the embodiment with a metal adhesion layer 46 a metal to metal bond is performed to bond the metallic sub-collector 40 to the metal adhesive layer 46. The adhesion layer 46 and metallic sub-collector 40 should be the same type of metal.

The target wafer 44 for an HBT may be made of InP. In another embodiment the target wafer 44 may be made of silicon carbide (SiC) or diamond to maximize the electrical and thermal conductivity benefit of the metallic sub-collector 40. In yet another embodiment the target wafer 44 may be made of a silicon wafer for heterogeneous integration with other circuits. For a BJT the target wafer 44 may be silicon (Si). In another embodiment the target wafer 44 for a BJT may be made of silicon carbide (SiC) or diamond to maximize electrical and thermal conductivity performance of the metallic sub-collector 40.

Figure 3F:
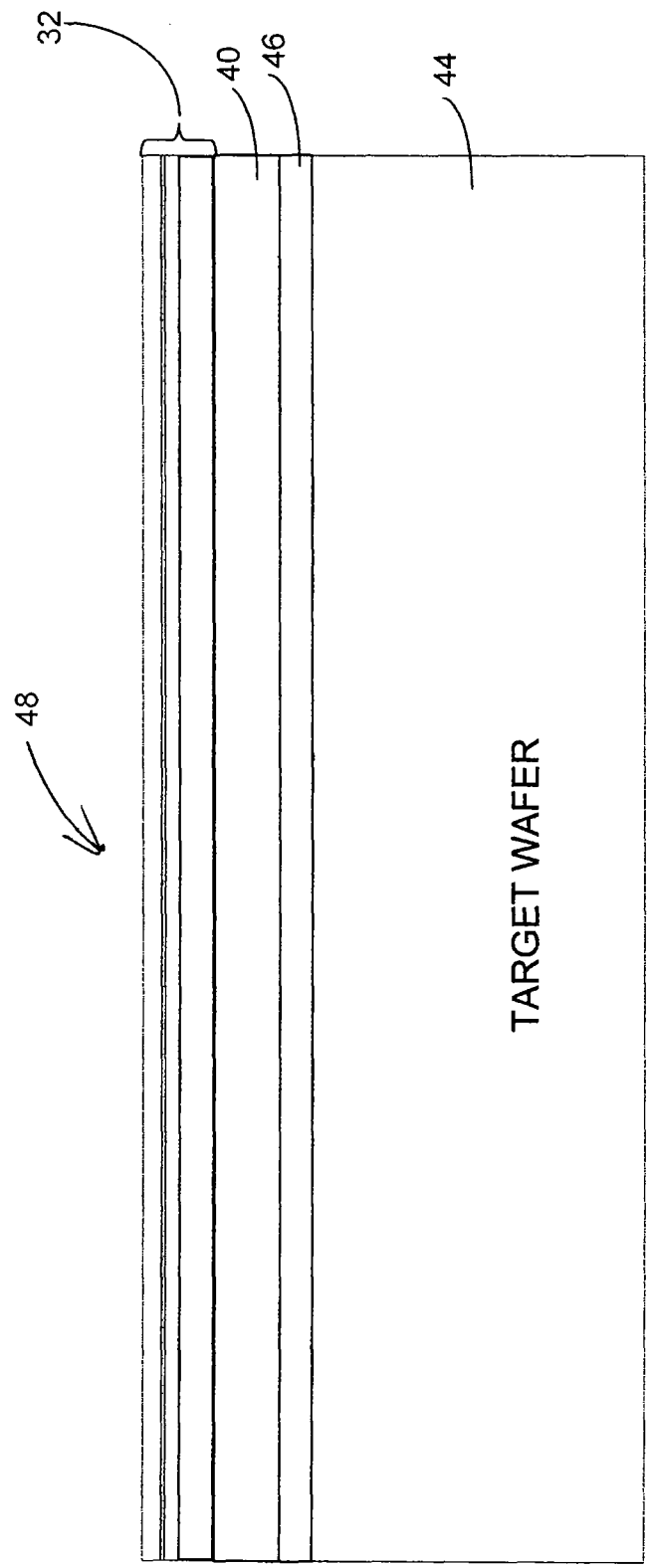
FIG. 3F is an elevation sectional view showing device layers on top of a metallic sub-collector bonded to a target wafer in accordance with the present disclosure.

After bonding of the target wafer 44 is completed, the handle wafer 34 is removed and the device layers 32 on top of a metallic sub-collector 40 remain. The resulting wafer 48 is shown in FIG. 3F.

Figure 4:
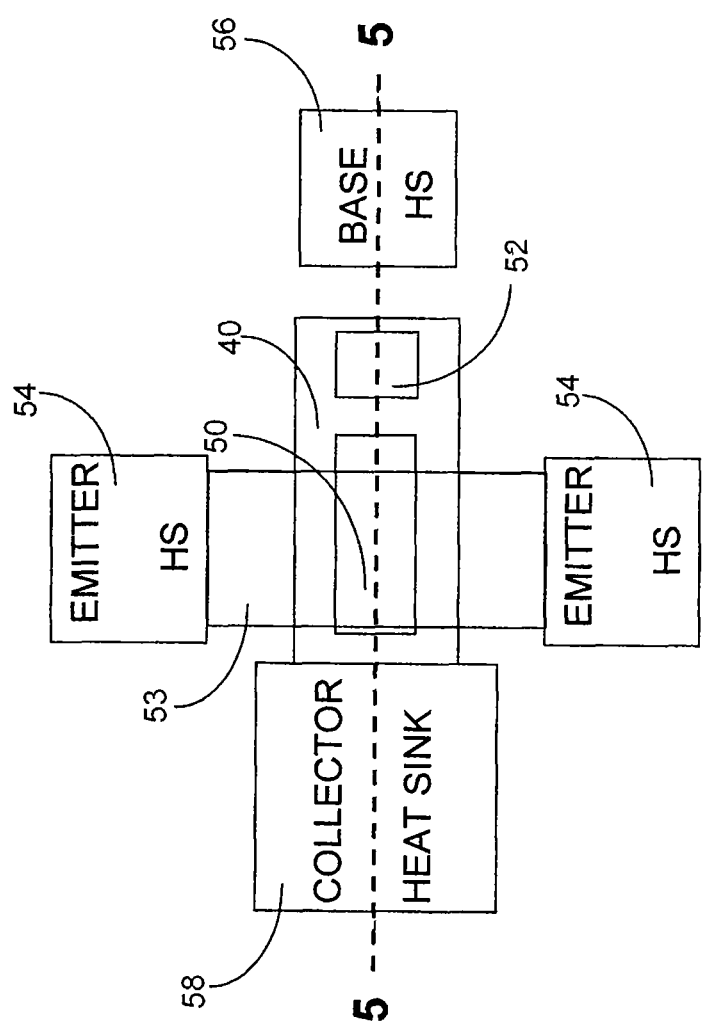
FIG. 4 is a cut away top view of an exemplary HBT in accordance with the present disclosure.

FIG. 4 is a top cut away view of an exemplary HBT showing the location of the metallic sub-collector 40 relative to the emitter contact 50 and the base contact 52. Also shown in FIG. 4 are emitter heat sinks 54, metal connection 53 from the emitter contact 50 to the emitter heat sinks 54, base heat sink 56 and collector heat sink 58.

Figure 5:
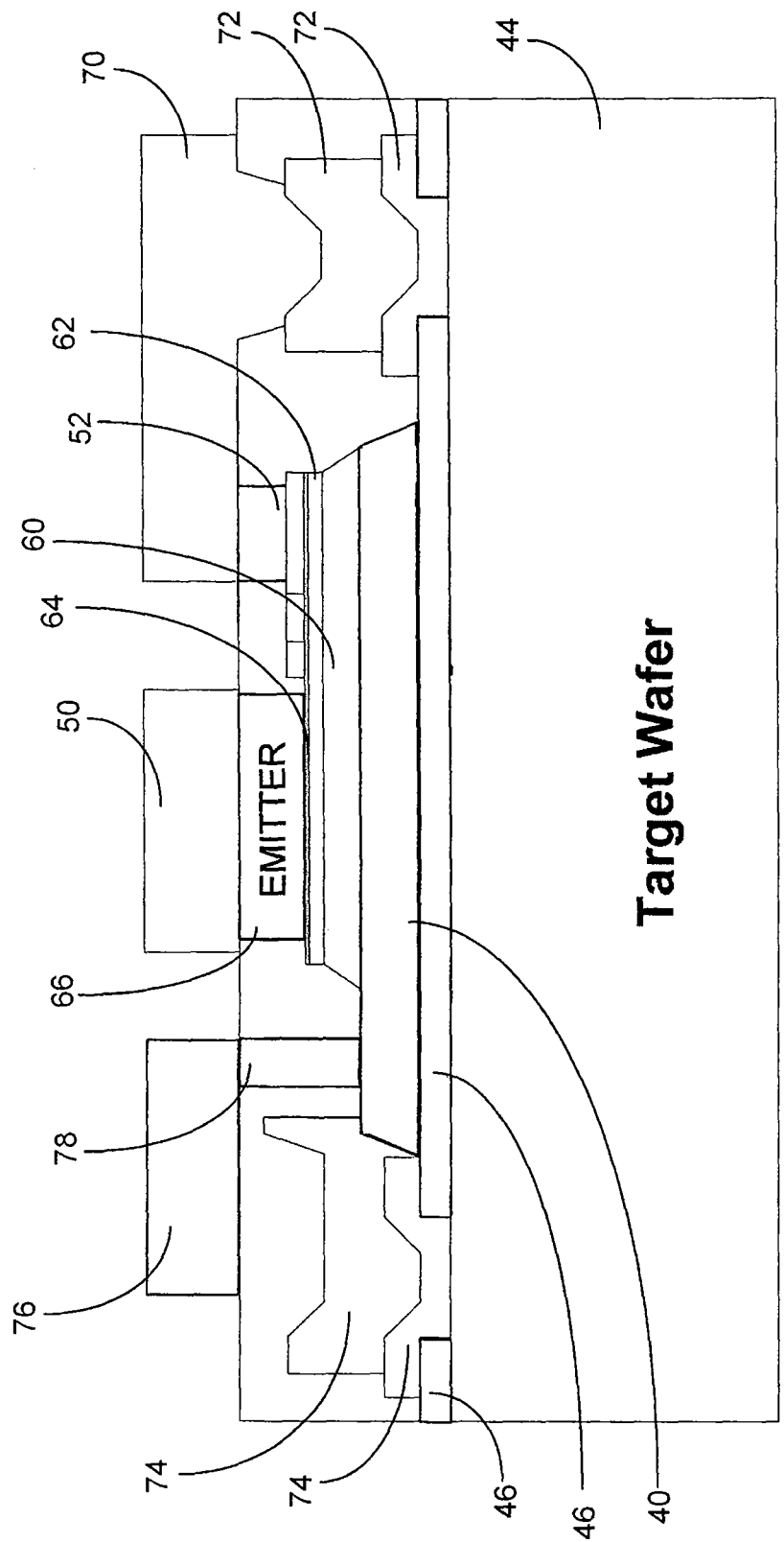
FIG. 5 is an elevation sectional view along line 5-5 of FIG. 4 of an exemplary HBT with metallic sub-collector in accordance with the present disclosure.

FIG. 5 is an elevation sectional view along line 5-5 of FIG. 4 of an exemplary HBT with a metallic sub-collector in accordance with the present disclosure. On top of target wafer 44 is the adhesion layer 46 and then the metallic sub-collector 40, which is underneath the collector 60. The metallic sub-collector 40 is electrically connected to collector contact 76 by via 78. Above the collector 60 is base-collector grade 62, base 64, emitter 66, and emitter contact 50. In another embodiment, as discussed above, a semiconductor sub-collector may be between the metallic sub-collector 40 and the collector 60.

Also shown in FIG. 5 is base contact 52, which may be provided a thermal path to the target wafer 44 by metal 70 and thermal vias 72. The collector 60 may also be provided a thermal path to the target wafer 44. The heat from the collector is conducted to metallic sub-collector 40 and then to the target wafer 44 by thermal vias 74. Similar thermal vias (not shown) to the target wafer 44 can be used to thermally conduct heat from the emitter 66 to the target wafer 44.

In the embodiments of SiC, diamond or any electrically insulating material for the target wafer 44, the thermal vias have minimal capacitive loading and impact to device performance. In an embodiment with a silicon wafer or other electrically conducting material for the target wafer 44, a p-n junction may be used to electrically isolate the HBT from the remaining target wafer yet still maintain an adequate thermal path; however, this may have a large capacitive loading penalty and may negate the performance benefits offered by the metallic sub-collector.

In an embodiment with a metal adhesion layer 46 on the target wafer 44, the thermal vias may not be needed, because the thermal conduction path to the target wafer would be directly through the adhesion layer 46.

Because the HBT, shown in FIG. 5, has a metallic sub-collector 40, excellent low resistance electrical and thermal contacts are formed. As described above, the metallic sub-collector 40 also acts as a heat spreader that can shunt heat generated by the HBT to adjacent interconnect or target wafer regions via the heat sinks 72, 74. The area required for the heat sinks 72, 74 would normally in the prior art be occupied by a large surface collector contacts needed for thermal conduction or left empty to prevent adjacent devices from increasing the localized temperature for the HBT.

Three dimensional (3D) thermal simulations show a 50% or more reduction in device thermal resistance ($R_{TH}$) between InP HBTs with and without a metallic sub-collector. Also the area required by an HBT is reduced by 50% for an HBT with a metallic sub-collector, due to the reduction in size of surface collector contacts for conventional HBTs. This footprint reduction may be used to increase transistor density or potentially improve yield if transistor density was left unchanged.

Figure 6:
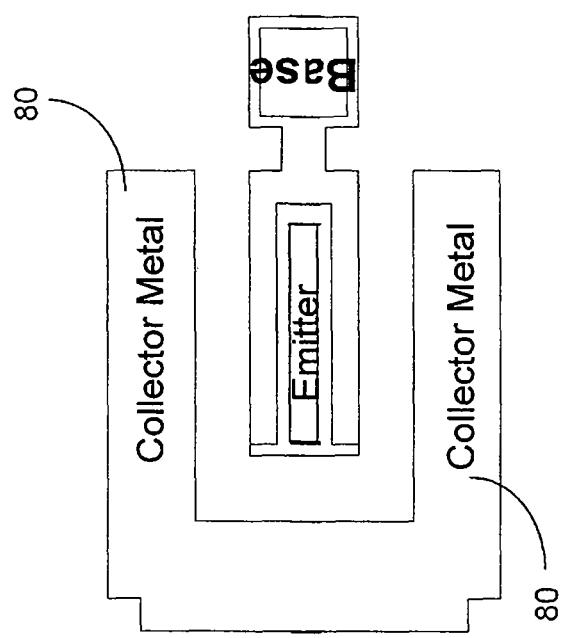
FIG. 6 is a top view of an exemplary HBT in accordance with the prior art.

In contrast, FIG. 6 is a top view of an exemplary conventional HBT in accordance with the prior art. Large surface collector contacts 80 are required to make electrical contact to the HBT. Since the collector surface contacts 80 are located on the surface adjacent to the HBT and are coupled to the collector of the HBT via a semiconductor sub-collector, the collector electrical resistance is substantially higher than for a metallic sub-collector. In addition, the heat generated by a conventional HBT device may travel from the collector (not shown) along the semiconductor sub-collector (not shown) before being removed through the metal collector surface contacts 80. The heat may also travel to the substrate, but this is not an efficient heat conduction path. The result is that an HBT with a semiconductor sub-collector has inefficient heat conduction paths, and the HBT performance is negatively impacted. As discussed above, conventional InP HBTs have been shown to have a 0.5 GHz $F_T$ reduction per ° C. of junction temperature rise.

An HBT with a metallic sub-collector enables the use of substrates with high thermal conductivity. An HBT with a metallic sub-collector, as described above, may be built on a SiC or diamond substrate, which are electrically insulating while having high thermal conductivity. These properties improve the performance of HBTs.

Figure 7:
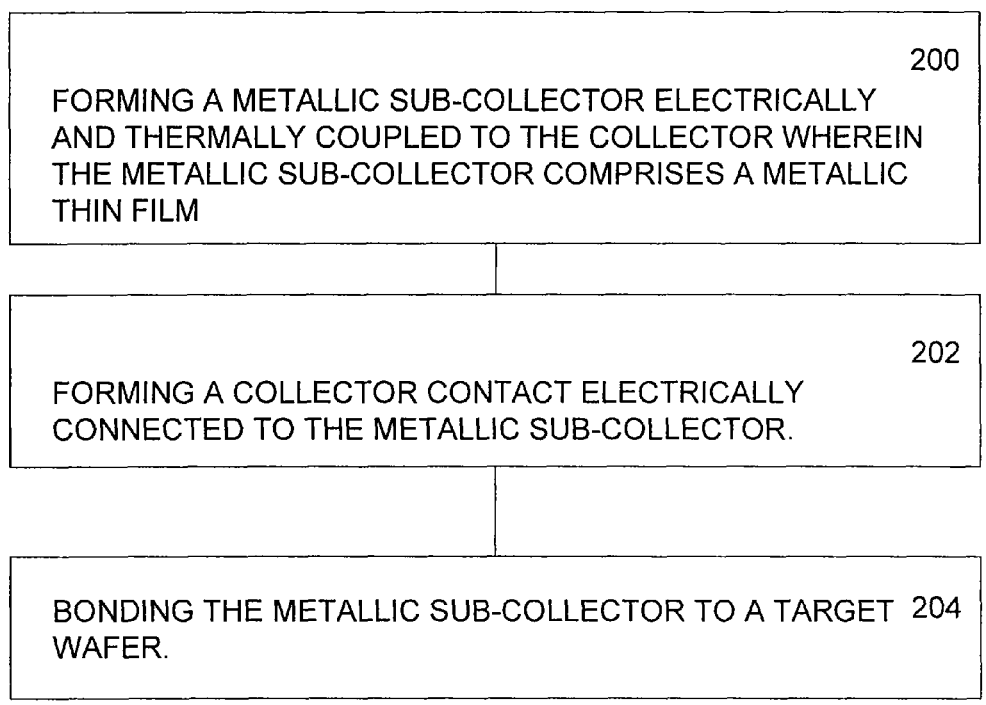
FIG. 7 is a method of providing a transistor having an emitter, a base, and a collector in accordance with the present disclosure.

FIG. 7 is a method of providing a transistor having an emitter, a base, and a collector in accordance with the present invention. In step 200 a metallic sub-collector is electrically and thermally coupled to the collector wherein the metallic sub-collector comprises a metallic thin film. In step 202 a collector contact is formed electrically connected to the metallic sub-collector. In step 204 the metallic sub-collector is bonded to a target wafer.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A bipolar transistor having an emitter, a base, and a collector, the bipolar transistor comprising:
   a substrate;
   a collector contact;
   a metallic subcollector coupled to the collector contact, and the metallic sub-collector electrically and thermally coupled to the collector, wherein the metallic sub-collector comprises a metallic thin film;
   an adhesion layer between the substrate and the metallic sub-collector, the adhesion layer bonded directly to the substrate and in direct contact with the substrate and bonded directly to the metallic sub-collector and in direct contact with the metallic sub-collector, wherein the adhesion layer consists of a single material; and
   a thermal via coupled to the metallic subcollector and coupled to the substrate for thermally coupling the metallic sub-collector to the substrate, wherein the thermal via contacts a top surface of the substrate through an opening in the adhesion layer.

2. The bipolar transistor of claim 1 wherein the metallic sub-collector comprises aluminum, copper or gold.

3. The bipolar transistor of claim 1 further comprising an indium phosphide collector contact layer between the metallic sub-collector and the collector.

4. The bipolar transistor of claim 1 further comprising a semi-conductor sub-collector between the collector and the metallic sub-collector.

5. The bipolar transistor of claim 1 wherein the bipolar transistor is a heterojunction bipolar transistor, a SHBT or a DHBT.

6. The bipolar transistor of claim 1
   wherein the substrate comprises SiC or diamond.

7. The bipolar transistor of claim 1 further comprising:
   a second thermal via thermally coupling the base to the substrate; and
   a third thermal via thermally coupling the emitter to the substrate.

8. The bipolar transistor of claim 1 wherein the adhesion layer is a glue.

9. The bipolar transistor of claim 1 wherein the adhesion layer is benzocyclobutane.

10. The heterojunction bipolar transistor of claim 1 wherein the adhesion layer is polyimide, spin on glass, or spin on epoxy.

* * * * *